(12) United States Patent
Gluschenkov et al.

(10) Patent No.: US 7,786,025 B1
(45) Date of Patent: Aug. 31, 2010

(54) ACTIVATING DOPANTS USING MULTIPLE CONSECUTIVE MILLISECOND-RANGE ANNEALS

(75) Inventors: Oleg Gluschenkov, Tannersville, NY (US); Viorel C. Ontalus, Danbury, CT (US); Vilmarie Soler, Wallkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/405,702

(22) Filed: Mar. 17, 2009

(51) Int. Cl.
  *H01L 21/00* (2006.01)
(52) U.S. Cl. .................... 438/799; 438/305
(58) Field of Classification Search ............. 438/799, 438/305, 795, 796, 797, 798, 306
  See application file for complete search history.

(56) References Cited

U.S. PATENT DOCUMENTS 6,747,245 B2   6/2004   Talwar et al.

2005/0282407 A1*   12/2005   Bruland et al. .............. 438/795
2008/0268597 A1*   10/2008   Wei et al. .................... 438/275

* cited by examiner

*Primary Examiner*—Walter L Lindsay, Jr.
*Assistant Examiner*—Reema Patel
(74) *Attorney, Agent, or Firm*—Cantor Colburn LLP; Ian MacKinnon

(57) ABSTRACT

A method of fabricating an integrated circuit includes providing a gate conductor spaced above a semiconductor substrate by a gate dielectric, a pair of dielectric spacers disposed on sidewall surfaces of the gate conductor, and source and drain regions disposed in the substrate on opposite sides of the dielectric spacers, wherein the gate conductor and the source and drain regions comprise dopants; and subjecting at least a portion of the dopants to at least 3 consecutive anneal exposures to activate the dopants, wherein a duration of each exposure is about 200 microseconds to about 5 milliseconds.

8 Claims, 7 Drawing Sheets

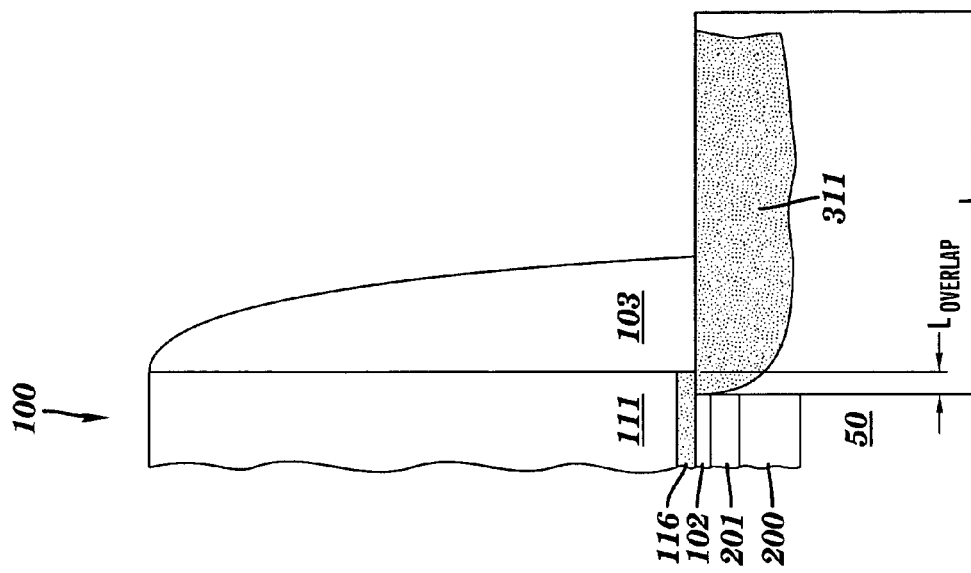
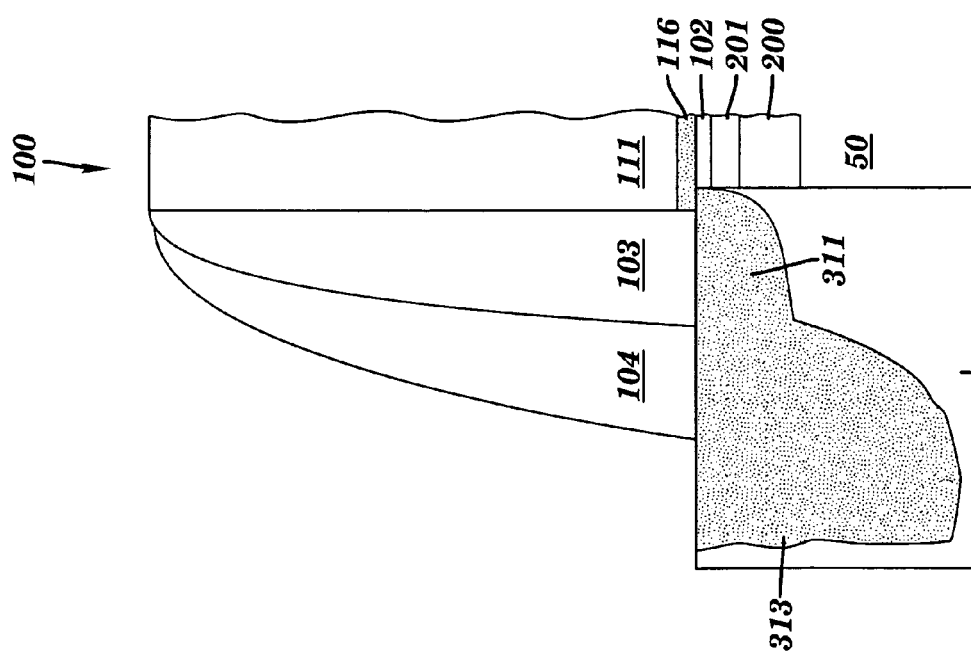

ACTIVATING DOPANTS USING MULTIPLE CONSECUTIVE MILLISECOND-RANGE ANNEALS

BACKGROUND

This invention relates to semiconductor fabrication, and particularly to methods of activating dopants using multiple consecutive millisecond-range anneals.

There are ongoing efforts to reduce the dimensions and increase the density of integrated circuit features. Modern integrated circuits (ICs) can include various types of active components such as n-type and p-type field effect transistors (NFETs and PFETs) as well as passive components such as resistors, diodes, electrical fuses, etc. The performance and variability of these components depend on the ability to uniformly activate dopants in semiconductor materials across different microstructures. Due to ongoing efforts to reduce the dimensions and increase the density and complexity of integrated circuit features, there is a continued need to increase the activation of such dopants without inducing excessive diffusion thereof. It is also desirable to maintain a high level of dopant activation across different devices and microstructures.

One specific example of the use of dopants is in the gate conductor and the source and drain regions on opposite sides of the channel of a MOSFET (metal oxide semiconductor field effect transistor) device. As MOSFET devices are scaled down to less than 100 nanometers in gate or channel length, highly doped, shallow source and drain extension regions can be employed to achieve high drive current capability. Currently, shallow source and drain extension regions are formed through the ion implantation of dopants into a semiconductor substrate near its surface on opposite sides of the gate conductor. The dopants are then activated by conducting laser annealing or other millisecond-scale annealing of the implanted extension regions either prior, during, or after a Rapid Thermal Anneal (RTA).

Laser annealing of semiconductors has been widely known in the art for the past several decades. However, up until very recently, it has not been employed in the fabrication of CMOS-based logic and memory ICs due to its large pattern effects, i.e., the sensitivity of laser energy coupling to layout patterns of various microstructures. These large pattern effects can lead to a highly non-uniform heating of various electrical devices and associated microstructures present on the wafer surface. Laser annealing can be characterized by the duration of exposure to its radiation. Pulsed lasers operate in a nanosecond-range regime with exposure durations of tens to hundreds of nanoseconds. At such short anneals, thermal activation of dopants can be inefficient. Consequently, the dopant activation process relies on a phase transition such as melting-recrystallization or solid phase epitaxial (SPE) regrowth of amorphized and doped semiconductors. Due to this reason, nanosecond-scale laser annealing is also referred to as melt laser annealing or pulsed laser annealing. Nanosecond-scale laser annealing has a very large temperature pattern effect because the laser energy absorbed in surface microstructures does not have sufficient time to spread uniformly within the substrate via thermal diffusion. In addition to large pattern effects, its reliance on inducing phase transitions in microstructures produces substantially different levels of dopant activation near exposure edges or in areas of exposure overlap. Nanosecond-scale laser annealing is usually operated in a step-and-repeat mode where a small portion of the wafer surface (typically entire IC rectangular die) is exposed to a pulse at once, followed by a step-and-repeat process to cover the entire wafer surface. This places undesirable areas of exposure overlap or exposure perimeter into the dicing channels that are not electrically usable.

In contrast, millisecond-scale laser annealing has exposure times ranging from several microseconds to tens of milliseconds. In this range, thermal activation of dopants can be efficient, and the concentration of active dopants is proportional to the peak anneal temperature. Continuous wave lasers are employed in this regime. Since the laser beam is shaped in the form of a line, the wafer surface is raster scanned, which means that it is scanned as a pattern of parallel lines or curves. In this case, the exposure time (also referred to as the dwell time) is equal to the characteristic beam width in the scanning direction (often defined at full width at half maximum (FWHM)) divided by the scan speed. The beam length (e.g., about 10 millimeters (mm)) perpendicular to the scanning direction (often defined at full width at 95-99% of the maximum) is usually much smaller than the wafer size (e.g., about 300 mm). As such, adjacent scans (also referred to as exposures) are often applied with some overlap to completely cover the entire wafer surface. In the overlap region, the wafer surface is exposed and annealed twice. Successful application of millisecond-scale laser annealing in IC fabrication depends on whether the overlap region has substantially the same properties as singly annealed regions. In contrast to nanosecond-scale laser annealing, this appears to be true for source and drain activation processes since common dopants undergo little diffusion during laser annealing and their activation depends on the peak anneal temperature in the absence of or after any phase transition processes in the doped material (e.g., after SPE process). Pattern effects can be reduced in millisecond-scale laser annealing by, for example, allowing more time for absorbed laser energy (i.e., heat) to evenly spread in the substrate via thermal diffusion.

BRIEF SUMMARY

In an embodiment, a method of fabricating an integrated circuit comprises: providing a gate conductor spaced above a semiconductor substrate by a gate dielectric, a pair of dielectric spacers disposed on sidewall surfaces of the gate conductor, and source and drain regions disposed in the substrate on opposite sides of the dielectric spacers, wherein the gate conductor and the source and drain regions comprise dopants; and subjecting at least a portion of the dopants to at least 3 consecutive anneal exposures to activate the dopants, wherein a duration of each exposure is about 200 microseconds to about 5 milliseconds.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 1(a) and 2(a) illustrate an example of a method for fabricating a transistor comprising dopants that are activated using multiple consecutive laser anneals;

FIGS. 1(b) and 2(b) illustrate another example of a method for fabricating a transistor comprising dopants that are activated using multiple consecutive laser anneals;

The detailed description explains the preferred embodiments of the invention, together with advantages and features, by way of example with reference to the drawings.

DETAILED DESCRIPTION

Turning now to the drawings in greater detail, it will be seen that FIGS. 1(a)-1(b) and FIGS. 2(a)-2(b) illustrate alternative exemplary embodiments of a method for activating dopants of IC devices using multiple millisecond-scale laser anneals, i.e., at least 3 exposures. This method offers superior dopant activation over using a single or double exposure laser annealing, resulting in considerable improvement in device performance and thus higher drive currents. This improved dopant activation can be achieved with reduced temperature variability across microstructures. Moreover, dopant activation using multiple exposures as opposed to a single or double exposure can be achieved at lower anneal temperatures. Therefore, the anneal process with multiple exposures is less likely to induce excessive diffusion of dopants and various defects associated with higher anneal temperatures such as substrate slip and bow, multiplication of existing line defects (e.g., stacking faults and dislocations), degradation of gate dielectric reliability parameters, local flow and associated thinning or thickening of the gate dielectric, and uncontrollable melting of silicon alloys.

Figures 1A, 1B:
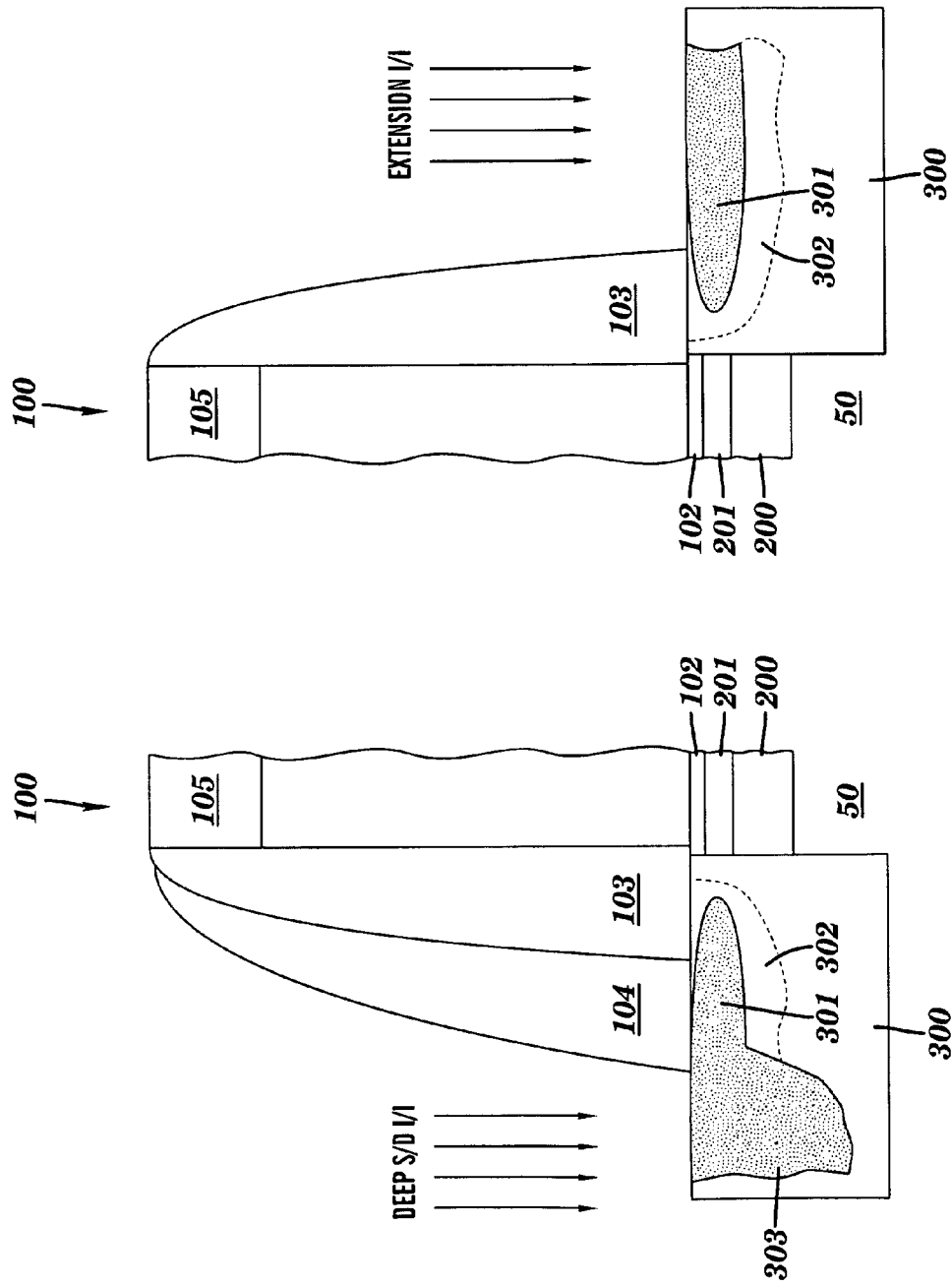

Referring to FIGS. 1(a) and 1(b), an NFET or PFET device can be fabricated by obtaining a bulk semiconductor substrate 50 comprising single crystalline silicon that has been slightly doped with n-type and/or p-type dopants and forming shallow trench isolation (STI) structures (not shown) in substrate 50 to isolate ensuing active and passive devices from each other. Alternatively, a semiconductor layer 50 can be formed upon an insulation layer disposed upon a substrate (not shown) to create silicon-on-insulator (SOI) structures before the formation of STI structures in layer 50. A gate dielectric 102 comprising, e.g., thermally grown silicon dioxide or oxynitride or a deposited high-k dielectric, can then be formed upon silicon-based substrate 10. Next, a gate conductor comprising, e.g., polycrystalline silicon (polysilicon), can be deposited upon the gate dielectric 102 and patterned to define a gate structure above a channel region 200 of the substrate 50. A first pair of thin dielectric spacers 103 (e.g., about 1 nanometer (nm) to 15 nm thick) comprising, e.g., silicon oxide, can be formed upon the sidewall surfaces of the gate conductor 100.

Subsequently, source and drain (S/D) regions 300 can be formed in the substrate 50 as described below that include dopants opposite in type from the dopants present in the channel region 200. Dopants can be introduced into the shallow S/D extensions 301 and an upper portion 105 of the gate conductor 100 using, e.g., an ion implantation technique. For only the embodiment depicted in FIG. 1(a), a second pair of dielectric spacers (e.g., about 5 nm to 100 nm thick) can further be formed upon the first pair of spacers 103, followed by introducing dopants into deep S/D regions 303 using, e.g., a deep, higher energy ion implantation technique. As formed, the shallow S/D extensions 301 are desirably about 5 nm to about 30 nm deep, and the deep S/D regions 303 are desirably about 20 nm to about 100 nm deep. Ion implantation processes can result in the formation of a thin amorphous layer 302 in the crystalline substrate 50 that is, e.g., about 5 nm to about 30 nm deep and that extends, e.g., about 5 nm to about 20 nm below the shallow S/D extensions 301.

N-type shallow S/D extensions for NFETs can be formed using a lithography technique to open the pre-selected regions where NFETs are to be formed and to block other regions with a photoresist or hard mask. N-type dopants can then be implanted into exposed regions of the substrate using an implantation energy of about 0.5 kilo electronVolt (keV) to about 10 keV and a dose of about 3e14 to about 1e16 ions/centimeters squared ($cm^2$). Similarly, p-type shallow S/D extensions can be formed by opening pre-selected regions where PFETs are to be formed and implanting p-type dopants using an implantation energy of about 200 eV to about 2 keV and a dose of about 3e14 to about 1e16 ions/$cm^2$. Deep S/D regions for both NFETs and PFETs can be formed in a similar way by adjusting the implantation energy to produce a desired depth. Examples of n-type dopants include but are not limited to arsenic and phosphorus, and examples of p-type dopants include but are not limited to boron and boron difluoride ($BF_2$). It is to be understood that both NFET and PFET devices can be formed in isolated areas of the substrate to form a CMOS (complementary metal-oxide semiconductor) IC. Various known ion implantation enhancement techniques can be employed to beneficially engineer defects in or around implanted layers, shape as-implanted dopant profiles, and alter thermal diffusion at later thermal steps. These techniques include but are not limited to angled, molecular, cluster, pre- and post-amorphization, co-implantation of different species, cold, hot, and plasma implantation processes.

As shown in FIGS. 2(a) and 2(b), a portion 116 of the gate conductor 100 directly adjacent to the gate dielectric 102 can influence transistor operation and its performance. The concentration of prevalent dopants at or near the gate dielectric interface is desirably about 5e19 $cm^{-3}$ to about 1e21 $cm^{-3}$. These dopants can be introduced by ion implantation, in-situ doping during gate conductor deposition, or other means. The type of prevalent dopants introduced to the interface sets a proper threshold voltage for the transistor and is desirably n-type dopants for NFETs and p-type dopants for PFETs. Absent of any metallic compounds in portion 116, the amount of active dopants placed near the gate dielectric interface is desirably sufficient to avoid an undesirable gate-conductor depletion effect that could otherwise electrically thicken the gate dielectric 102, yielding low transistor performance.

Although not shown, precision resistors can also be formed in ICs that provide various analog functions such as impedance matching. These resistors can be formed using either isolated islands of doped semiconductor substrate or doped semiconductor material deposited upon the substrate. The islands can be connected to other elements using conductive interconnects. The resistance value of these devices depends on the geometry of the island and the amount of active dopants in the semiconductor material. The islands can be formed using lithography and etch techniques, and the dopants can be introduced therein either during S/D implantation steps or using a separate block mask with a specialized implant. The dopant dose employed in these islands can be about 1e14 to about 1e16 ions/cm$^2$. It is desirable that the thermal activation of such dopants does not introduce substantial variation of resistor values due to uneven activation across a given IC surface.

While the examples described herein are given using planar transistor geometry, other transistor gate, channel, and source/drain geometrical structures can also be employed. For instance, various multi-gate 3-dimensional structures of the channel and the gate regions are contemplated. Other useful structures can be present in various parts of the transistor regions and other parts of the substrate. For instance, the S/D regions can include stressors, the channel region can include low mobility structures, and/or the gate region can include metallic elements. Some elements of these structures also can be sacrificial and thus would be disposed, replaced, or altered during later steps. The substrate can further include buried insulator regions, isolation regions with or without stressors, deep-trench capacitors, and/or diodes. In addition, the dopants and co-dopants in the S/D regions can be introduced by techniques other than ion implantation such as in-situ doping during epitaxial growth, gas phase doping, or solid source doping.

Referring back to FIGS. 1(a)-2(b), after transistor devices with shallow S/D extensions 301 are formed, a first sequence of thermal annealing can be conducted. This thermal annealing sequence is directed toward creating an overlap between the edges of the gate conductor 100 and the tip of the shallow S/D extensions 301 and to remove defects introduced during ion implantation. Comparing elements in FIGS. 1(a)-1(b) and FIGS. 2(a)-2(b), this anneal can instigate diffusion of dopants in S/D extensions 301 to cause those extensions 301 to extend laterally under the sidewalls of the gate conductor 100. This anneal can also re-crystallize amorphous layers 302 and heal defects in the damaged crystalline material. This anneal sequence can include an anneal (e.g., a flash lamp anneal) that is longer than millisecond (msec)-range (i.e., has a duration of greater than about 5 msec), a rapid thermal anneal (RTA), an anneal within millisecond-range (i.e., has a duration of about 200 microseconds (μsec) to about 5 msec), a furnace anneal, or a combination comprising at least one of the foregoing anneals. Performing a longer than msec-range anneal can enable diffusion, re-crystallization, and defect healing or engineering. During a spike RTA process, the wafer can be heated at a rate of about 10° C./s to about 1000° C./s and then cooled down at a rate of below 100° C./s. The peak temperature of the RTA can be about 700° C. to 1100° C. More specifically, the spike RTA process can have a ramp up heating rate of about 50° C./s to about 250° C./s and a cool down rate of about 70° C./s to about 50° C./s, with a peak temperature of about 950° C. to about 1080° C. or even more specifically about 1000° C. to about 1070° C. The duration of the RTA measured within 50° C. of the peak temperature can be, for example, about 1 to 2 seconds. The msec-range anneal can be conducted prior to the RTA, enabling a fast re-crystallization of semiconductor amorphous material and quick out-diffusion of certain mobile defects such as silicon vacancies and interstitials. The msec-range anneal can also be conducted during RTA when the wafer is hot to aid in defect and diffusion engineering. A low-temperature furnace anneal can also be conducted at a temperature of about 400° C. to about 700° C. to also aid in defect and stress engineering. More specifically, the furnace anneal can be performed at a temperature of about 550° C. to about 700° C. for a duration of about 15 minutes to about 1 hour. This anneal sequence desirably has a suitable thermal budget for completing re-crystallization of the amorphous layers 302 and other phase transitions therein and for establishing an overlap between tips of shallow S/D extensions 301 and the edges of the gate conductor 100. The resultant overlap can be about 0 nm to about 5 nm measured from the gate edge. When the overlap is 0 nm, the gate edge is aligned with the tips of extensions. Another feature of this anneal sequence is the diffusion of dopants in the gate conductor 100 to form a highly doped gate conductor 111 with a high concentration of dopants near the gate dielectric interface within region 116.

Subsequent to the first anneal sequence, a second anneal sequence can be conducted that is directed toward higher thermal activation in the doped regions without inducing a significant amount of diffusion. The second anneal sequence can be performed immediately after the first anneal sequence or after some additional processing steps if desired. The strategy of a person of ordinary skill in the art would probably be to use a high-temperature anneal lasting for a short period of time so as to achieve high thermal activation while ensuring the absence of excessive diffusion. As applicable to msec-scale laser anneals, such strategy suggests selecting a high-temperature anneal of about 1300° C. to 1375° C. with a short dwell time of about 50 μsec to about 600 μsec.

It has been unexpectedly discovered that multiple (e.g., greater than 3 exposures or anneals) consecutive msec-range laser anneals of n-type and p-type doped semiconductors, such as silicon and its alloys, to a moderate peak temperature of about 1100° C. to about 1350° C. can yield a substantial increase in the activation of n-type dopant while yielding minimal change in diffusion of the respective p-type dopant. As the number of consecutive laser anneals increases from 2 to 12, the sheet resistance of one-dimensional n-type S/D regions decreases by about 15% to about 20% while showing negligible lateral diffusion of p-type dopant as measured by PFET extension overlap capacitance. By way of example, boron in PFET S/D extensions diffuses faster than arsenic in NFET S/D extensions at a given anneal temperature and anneal time. It has been discovered that incremental dopant diffusion is not induced and the activation of n-type dopants is substantially increased when multiple anneals are employed. It has also been discovered that the effect is stronger at longer dwell times. Accordingly, the dwell or exposure time of the anneal is desirably about 200 μsec to about 5 msec, more specifically about 0.5 msec to about 1.5 msec. Further, it has been discovered that the effect is stronger if the thermal budget in the first anneal sequence is lower. Thermal budget is lower when either the anneal temperature or the anneal time is lower. In addition, it has been discovered that the strongest relative effect occurs when the first anneal sequence includes only msec-range anneals that fully re-crystallize amorphous semiconductor layers. Increasing the number of consecutive anneals from 12 to 24 provides a marginal additional improvement in n-type dopant activation. Therefore, the msec-range anneal is desirably repeated for about 3 to about 12 times.

It has also been discovered that the activation benefit obtained from 12 consecutive anneals at a given moderate peak temperature is equivalent to that obtained through single or double laser exposure anneals performed at a temperature 100° C. to 200° C. higher than the temperature of the 12 consecutive anneals. For instance, in this respect, a 1250° C. anneal conducted 12 times is equivalent to a 1375° C. double anneal. Semiconductor wafer builds can exhibit a slip threshold of about 1325° C. to about 1350° C., a melt threshold of about 1300° C. to about 1350° C. for SiGe semiconductor alloys that are often present in these wafer builds, and gate dielectric degradation threshold of about 1300° C. to about 1350° C. Due to such undesirable effects, single or double msec-scale anneals are desirably kept at or below about 1300° C. to about 1350° C. In contrast, multiple, consecutive msec-scale anneals do not appear to induce any substantial undesirable effects as compared to a double anneal conducted at the same peak temperature. Therefore, multiple, consecutive msec-scale anneals can be used to obtain substantial dopant activation at a moderate anneal temperatures of about 1,150° C. to about 1300° C., thereby opening up the process window with respect to undesirable defect creation at the high temperature range of at or above 1300° C. to about 1350° C.

It has additionally been observed that the multiple, consecutive msec-scale anneals have a substantial advantage over a single anneal conducted at the same peak temperature but for a longer time. Further, it has been discovered that certain structural characteristics of semiconductor substrates exposed to multiple, consecutive msec-scale anneals do not show any degradation with increased number of such anneals while some of these structural characteristics show a consistent degradation with increased anneal time. More specifically, these structural characteristics of the substrate include its flatness, degree of distortion, and structural integrity (absence of cracks, for instance). The first two parameters are related to inducing substantial plastic deformation within the substrate that results in its permanent deformation or distortion. Once the substrate is deformed and/or distorted, subsequent precision lithographic processes yield increased error and variability of certain patterning parameters such as increased pattern overlay error and increased overlay scatter. Accordingly, the lithographic overlay error and its scatter measured at the contact via lithography step, for instance, can serve as a direct and sensitive parameter for assessing degree of wafer distortion induced in prior processing steps, including the step with multiple laser anneals. Alternatively, the wafer warpage or bow can be measured before and after the laser anneal step. The difference in wafer bow or warpage provides a measure of induced wafer distortion. Further, a direct observation of evolving micro and macro slip planes and other crystallographic plane and line defects via various microscopic techniques can also provide a measure of induced wafer distortion. Assessment of these structural parameters yield a conclusion that multiple, consecutive msec-scale anneals do not degrade pattern overlay errors and tolerances in subsequent lithographic steps and do not increase wafer warpage or bow with increasing number of such anneals for certain "prime" semiconductor substrates.

Patterned "prime" substrates or product wafer builds are characterized by a low concentration of certain types of stacking faults and dislocations in its bulk. It has been observed that threading dislocations associated with stress relaxation in crystalline films and/or extrinsic stacking faults bordered by dislocations and associated with precipitation of self-interstitials should be at a low concentration in the upper portion of the substrate of approximately 10 to 20 μm from its top surface to allow for conducting multiple laser anneals without any wafer distortion. The concentration of these defects depends on both starting substrates, microstructures formed on the substrate surface, and processes conducted prior to the laser anneal. In one embodiment, an area density of such defects can be equal to or lower than $10^5$ cm$^{-2}$ at any plane in the upper 10 to 20 microns of substrate thickness. In contrast, it has been observed that crystal originated particles (COPs) that are often present in the bulk portion of the substrate do not interfere with multiple laser anneals. It has also been observed that these substrates could contain edge defects (e.g. edge slip lines), typically within 3 mm of the wafer edge, that do not substantially grow or multiply when exposed to multiple laser anneals. It has further been discovered that large edge defects (e.g. cracks) result in catastrophic wafer breakage that occurs during the first anneal, hence, yielding little dependence of the wafer breakage on the number of exposures. A preferred prime SOI substrate is a bonded-type SOI substrate with a low concentration of aforementioned defects, as specified above, in the handler wafer (i.e. below the buried oxide). A preferred bulk substrate has a low concentration of threading dislocations as specified above in microstructures formed on its surface.

Figure 3B:
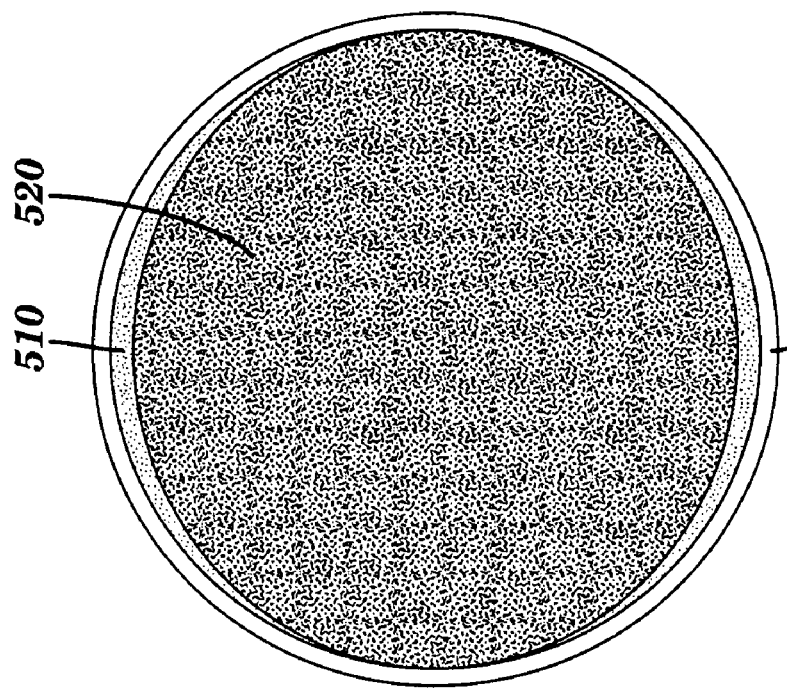
FIGS. 3(a) and 3(b) schematically illustrate an example of how a wafer can be raster-scanned by a laser.
Figure 3A:
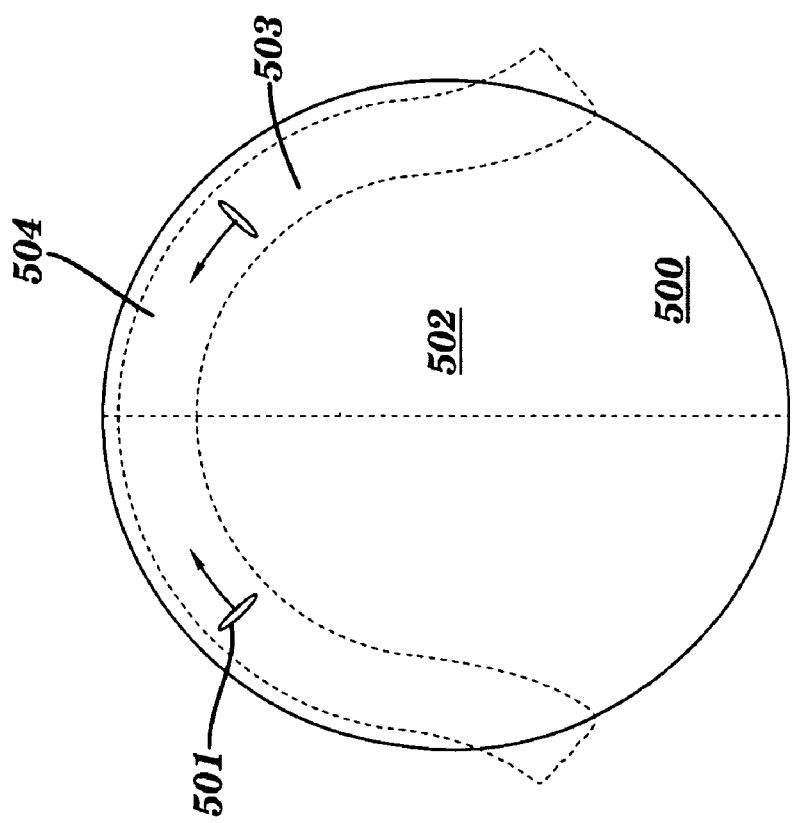

These multiple laser anneals can also be employed to reduce pattern effects and variations in the resistance value of the precision resistor. The wafer exposure pattern can be beneficially randomized or offset from exposure to exposure in such a way that the beam trajectory does not repeat substantially the same path multiple times. This randomization can be used, for example, by using small stepping increments, by exposing with dissimilar (e.g. orthogonal) trajectories or by using a hybrid exposure pattern where both small increments and dissimilar trajectories are combined. In a first example illustrated in FIG. 3a, 8 consecutive anneals can be accomplished by performing four passes with double-scanning in each pass. The wafer 500 can be raster-scanned by a beam 501 in an arc-like fashion. Scans can be stepped along the diameter line 502 at half-beam intervals, creating overlap region 503. Area 504 near the wafer edge can be singly-scanned and can require additional edge scans to improve dopant activation uniformity near the wafer edges. The entire wafer can be double-scanned to complete one pass. In order to randomize scanning, the entire scanning area in each pass can be slightly shifted with respect to each other by, e.g., ⅛ of beam length as shown in FIG. 3b, which depicts the scanned area of one pass 510 slightly offset with respect to the scanned area of another pass 520.

Figure 4:
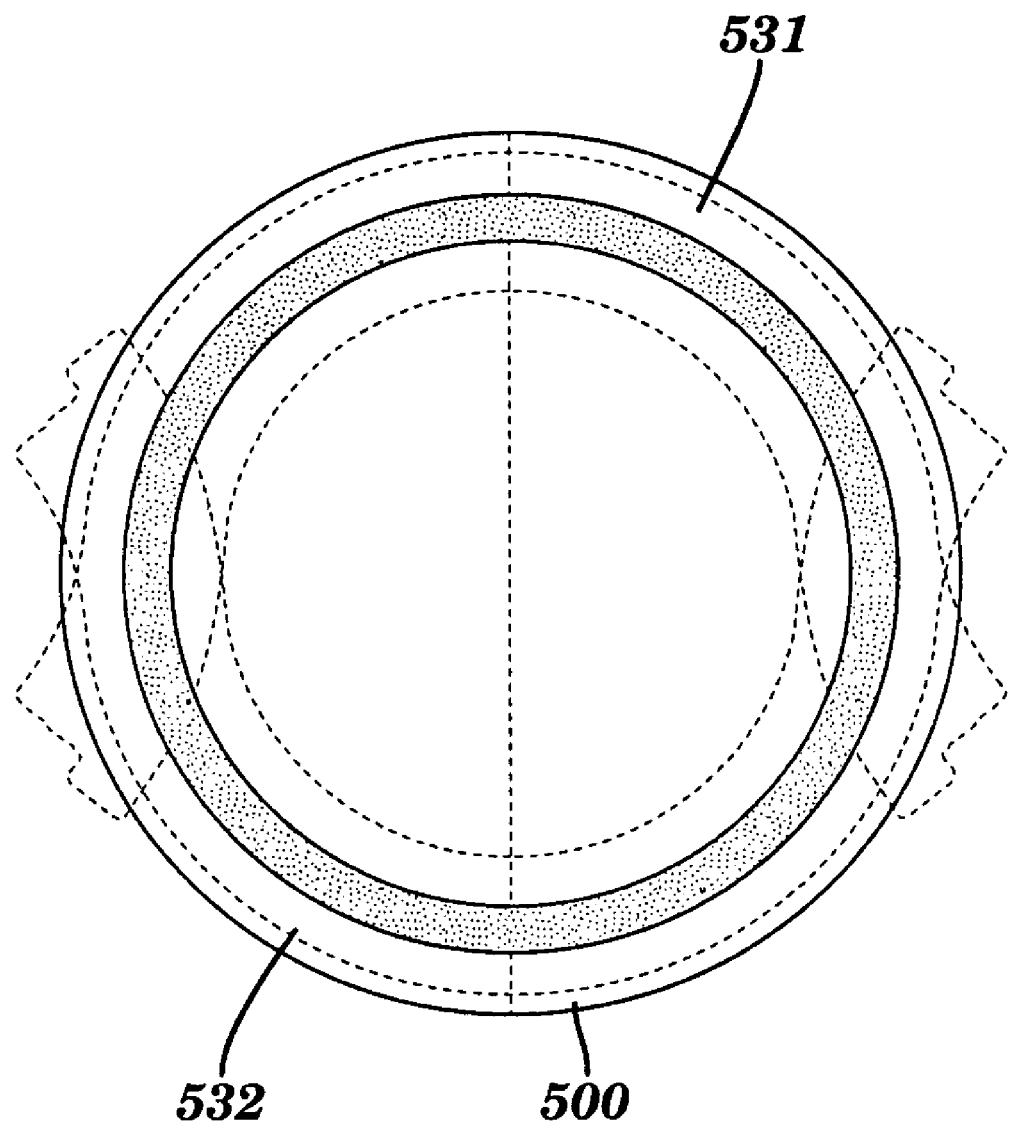
FIG. 4 schematically illustrates another example of how a wafer can be raster-scanned by a laser.

In a second example (not shown), a similar exposure pattern can be realized via one pass but with small beam steps of about ⅛ of beam length. Multiple scans near the wafer edge can still be needed. In a third example shown in FIG. 4, 8 consecutive anneals can be accomplished by performing 2 pass scanning in one direction 531 and 2 pass scanning in a different direction 532 with double-scanning in each pass. As shown, the scanning is desirably conducted in semi-circular fashion where the beam trajectory follows half of the wafer circumference stepping along its diameter. In this case, two different scanning trajectories can be used that have nearly orthogonal arc-like paths and that are inverted or mirrored with respect to each other. This example often utilizes at least 2 times less additional scans at the wafer edges while still providing trajectory randomization. A practical way to reduce the number of additional scans near wafer edge can be to dictate a partial trajectory randomization where the beam trajectory is repeated less than half of the total number of consecutive anneals. For instance, in the previous example, if each pass has essentially the same scanning area, the beam trajectory can be repeated twice.

It is to be understand that while the multiple, consecutive msec-scale anneals are described above in reference to laser anneals, such anneals could also be performed using other millisecond-range anneal tools such as a flash lamp tool or an electron-beam tool.

EXAMPLE

The following non-limiting example further illustrates the various embodiments described herein.

The dopant activation method described herein was reduced to practice using 45-nm high-performance CMOS technology. A plurality of PFETs and NFETs were built on an SOI substrate. Shallow S/D extensions offset from each gate conductor by a first dielectric spacer were formed utilizing ion implantation of arsenic and $BF_2$ (molecular) for the NFET and PFET devices, respectively. Deep S/D regions were offset from the gate conductor by the first dielectric spacer and a second dielectric spacer were formed by ion implantation of arsenic and boron. The NFET polysilicon gate conductors were additionally implanted with phosphorus ions in order to provide a specified high concentration of n-type dopants near the gate dielectric interface. Precision resistors were formed by implanting boron with a specialized block mask to complete IC fabrication. The foregoing IC fabrication was repeated on different SOI substrates to form several samples. Each sample was subjected to a first anneal sequence that included a furnace anneal and an RTA. These anneals were conducted non-consecutively, i.e., other IC fabrication steps were performed between the anneals. The combined thermal budgets of these anneals enabled full re-crystallization of the amorphous regions in the substrate and creation of a 1 to 3 nm overlap between the S/D extensions and the gate edges for all NFETs and PFETs. Subsequently, each sample was subjected to either 8 or 12 consecutive laser anneals using a dwell time of about 0.8 msec and either four or six repeating passes with double scanning in each pass, respectively. The anneal temperature was different for each sample and was selected conservatively to be within the 1200° C. to 1300° C. range, avoiding any chance of degrading reliability parameters and inducing defects. Additional samples were used as references by subjecting them to a single pass (single double scan) laser anneal at different temperatures. After this annealing sequence, additional IC fabrication steps were performed that did not exceed 480° C.

Figure 5:
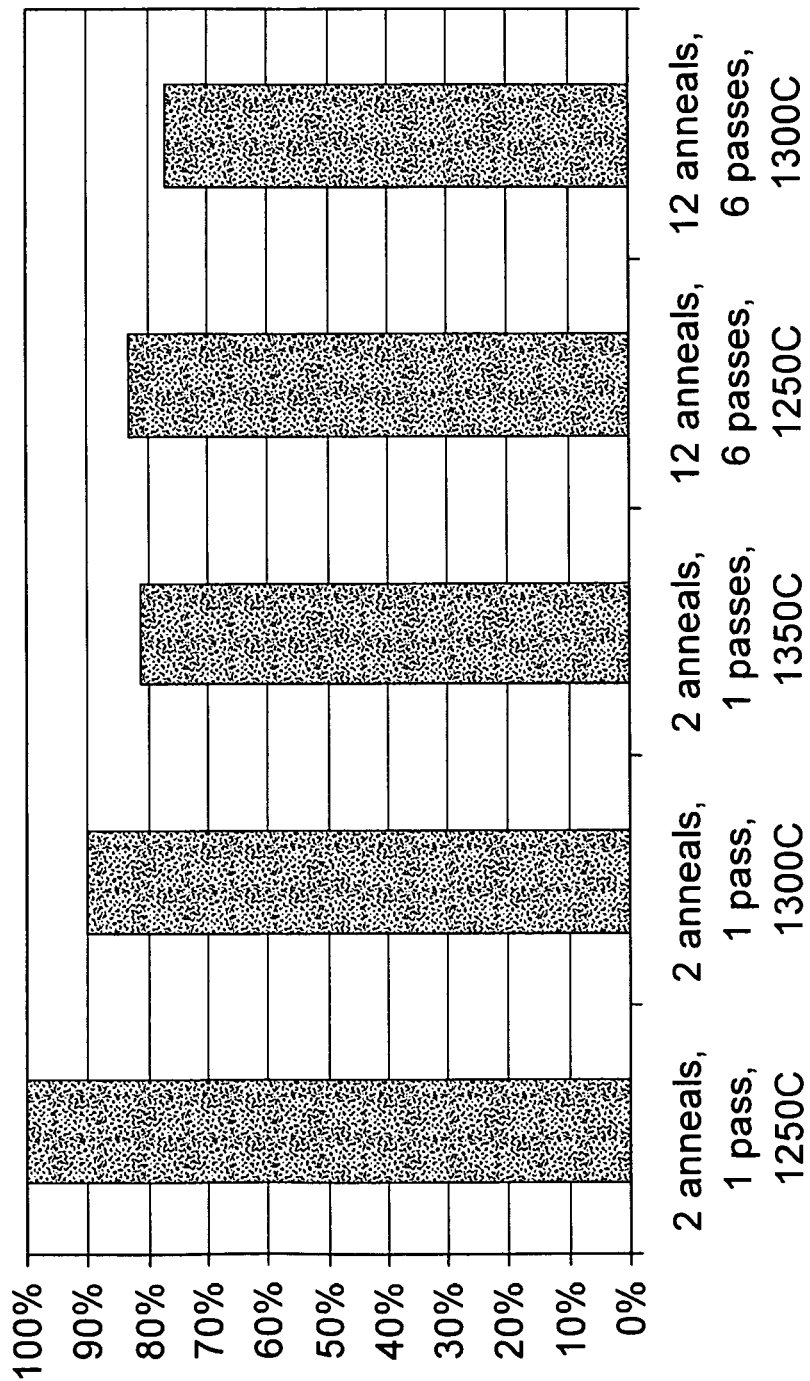
FIG. 5 graphically illustrates normalized one-dimensional (1-D) sheet resistances (Rs) for NFET source and drain extension regions that have been subjected to laser annealing at different conditions.
Figure 6:
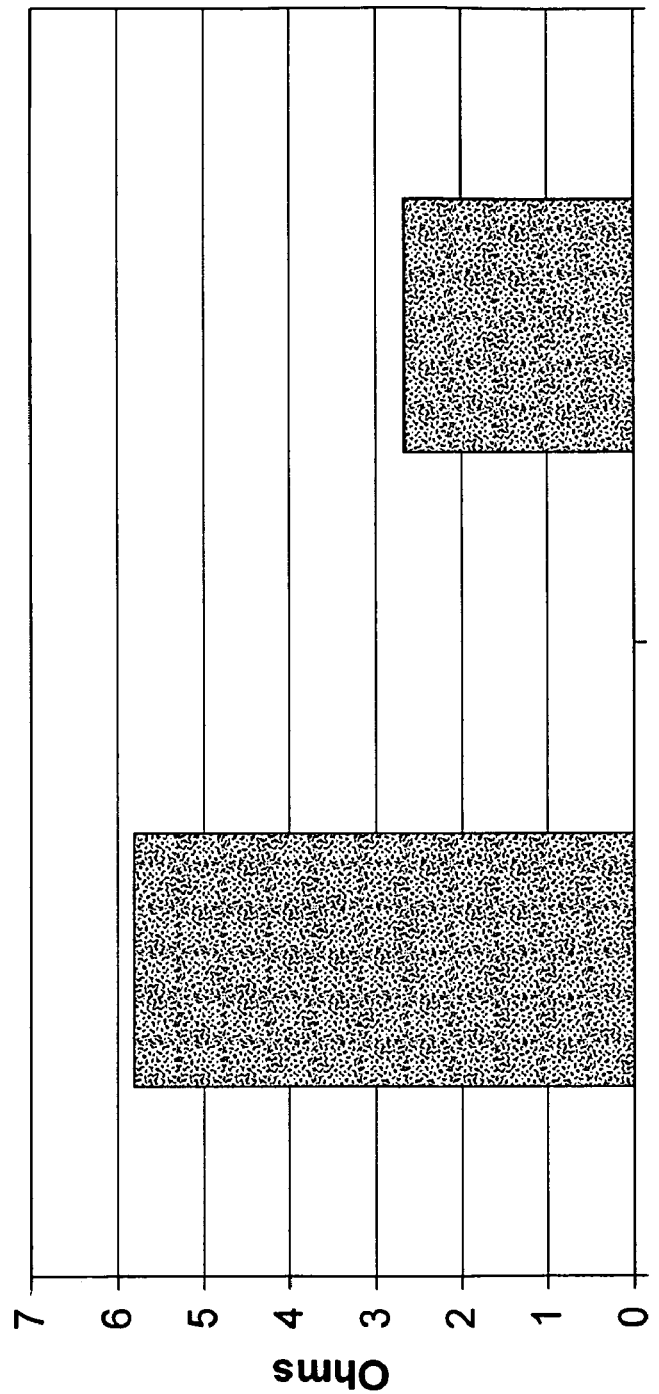
FIG. 6 graphically illustrates the resistance variability of precision resistors that have been subjected to laser annealing at different conditions.

FIG. 5 shows the normalized resistances of the one-dimensional NFET S/D extensions present in the samples formed as described above. Transistors, resistors, and circuits with 4 to 6 double-scanned passes showed a substantial improvement as compared to those devices annealed with a single double-scanned pass. This improvement in dopant activation resulted in the improvement of other NFET parameters and circuits containing such NFETs. For instance, NFET series resistance was decreased by about 10% to 20%. NFET gate activation was increased, yielding a reduction in equivalent gate oxide electrical thickness of about 0.8 to 1 Angstrom. NFET "ON" current was improved by 4% to 8%, and ring oscillator switching frequency at constant power consumption was increased by 1% to 3%. In addition, the resistance variability of the precision resistor was reduced by half as shown in FIG. 6, and PFET devices were not degraded.

Figure 7:
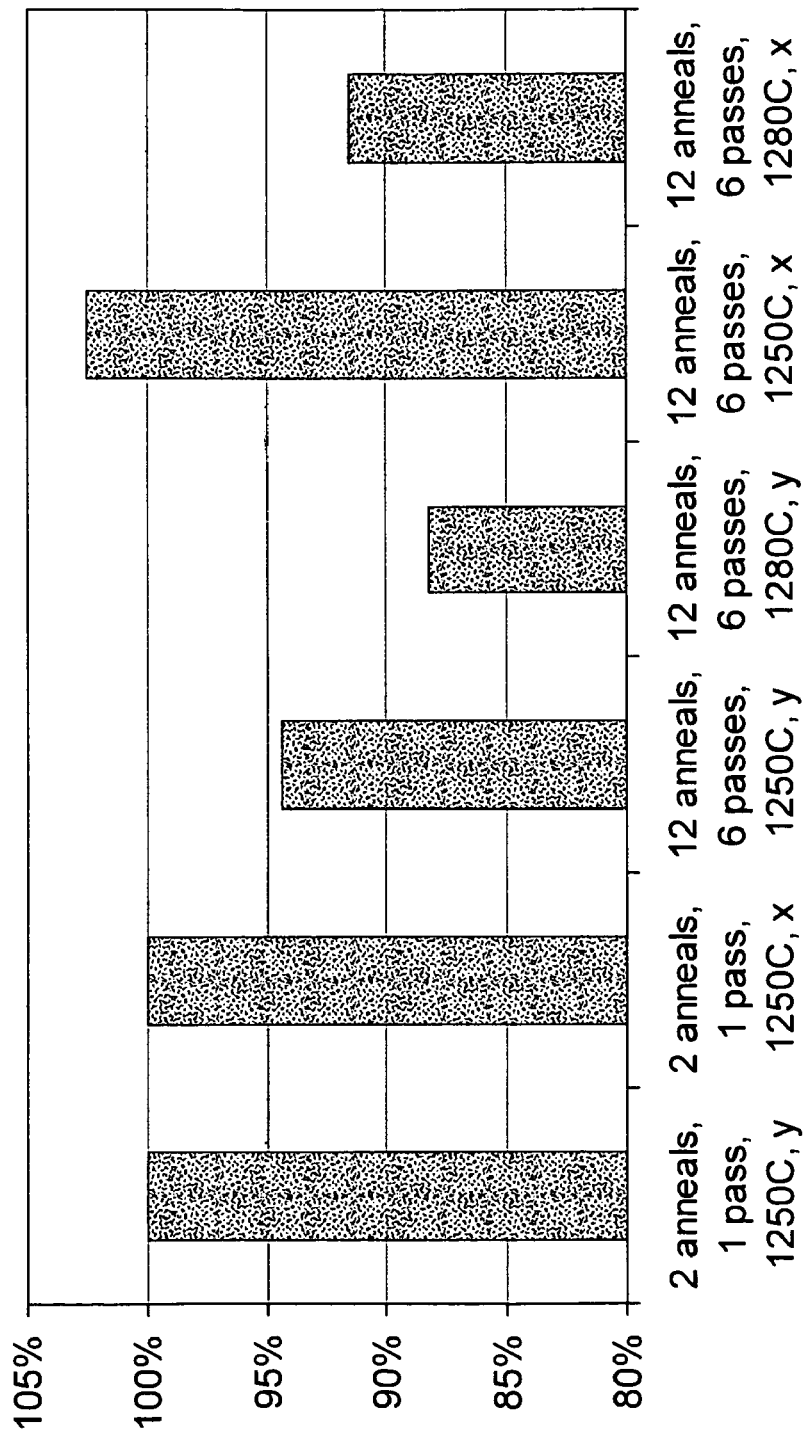
FIG. 7 graphically illustrates the normalized standard deviation of pattern overlay tolerances in both the x- and y-directions that were printed after the wafer was subjected to laser annealing at different conditions.

At the same time, no defects associated with the multiple msec-range anneals were observed in the "prime" SOI substrates used in this example. These substrates are characterized by a low concentration of certain defects at immediately prior to the laser annealing step, as alluded above. FIG. 7 graphically illustrates the normalized standard deviation of overlay tolerances in both the x- and y-directions of a printed contact via pattern. The contact via pattern is printed after these wafers have been subjected to laser annealing at different conditions. The overlay tolerances were not degraded by using 12 multiple, consecutive msec-range anneals or exposures. Similarly, Table 1 illustrates a change in wafer bow induced by multiple, consecutive msec-range anneals. No additional wafer bow was observed in the case of "prime" substrates (A) used in this example. In contrast, 8 consecutive msec-range anneals drastically warped the defective substrates (B) also employed in this example.

TABLE 1

Change in wafer bow during laser annealing for substrates used in the foregoing example. Substrate A is a "prime" SOI substrate and substrate B is defective. Bow accuracy measurement is +/−3 μm.

|  | Substrate A 2 exposures 1 pass | Substrate A 12 exposures 6 passes | Substrate B 8 exposures 4 passes |
|---|---|---|---|
| Bow Change, μm | +0.15 | −0.2 | +318.4 |

As used herein, the terms "a" and "an" do not denote a limitation of quantity but rather denote the presence of at least one of the referenced items. Moreover, ranges directed to the same component or property are inclusive of the endpoints given for those ranges (e.g., "about 5 nanometers (nm) to about 20 nm," is inclusive of the endpoints and all intermediate values of the range of about 5 nm to about 20 nm). Reference throughout the specification to "one embodiment", "another embodiment", "an embodiment", and so forth means that a particular element (e.g., feature, structure, and/or characteristic) described in connection with the embodiment is included in at least one embodiment described herein, and might or might not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating an integrated circuit, comprising:
   providing a gate conductor spaced above a semiconductor substrate by a gate dielectric, a pair of dielectric spacers disposed on sidewall surfaces of the gate conductor, and source and drain regions disposed in the substrate on opposite sides of the dielectric spacers, wherein the gate conductor and the source and drain regions comprise dopants; and
   subjecting at least a portion of the dopants to at least 3 consecutive laser anneal exposures to activate the dopants, wherein a duration of each exposure is about 200 microseconds to about 5 milliseconds; and
   wherein each anneal exposure comprises randomizing an exposure pattern of semiconductor substrate by multiple raster scanning passes in an arc-like fashion in which shifting subsequent passes by a laser beam are shifted with respect to previous passes.

2. The method of claim 1, wherein the at least 3 consecutive laser anneal exposures are performed at a peak temperature of about 1100° C. to about 1350° C.

3. The method of claim 1, further comprising annealing the source and drain extension regions prior to the at least 3 consecutive anneal exposures to cause the source and drain regions to extend laterally under sidewall surfaces of the gate conductor and to re-crystallize amorphous regions of the substrate.

4. The method of claim 3, wherein said annealing is performed for a duration of greater than about 5 milliseconds.

5. The method of claim 1, wherein the semiconductor substrate comprises single crystalline silicon.

6. The method of claim 5, wherein an upper portion of the single crystalline silicon comprises threading dislocations and/or stacking faults having an area density that is equal to or less than about $10^5$ cm$^{-2}$ at a plane in the upper 10 to 20 micrometers of the silicon.

7. The method of claim 6, wherein the semiconductor substrate is a silicon-on-insulator substrate.

8. The method of claim 1, wherein the semiconductor substrate is a silicon-on-insulator substrate.

* * * * *